United States Patent
Lin

(10) Patent No.: US 7,760,817 B2
(45) Date of Patent: Jul. 20, 2010

(54) COMMUNICATION SYSTEM FOR UTILIZING SINGLE TONE TESTING SIGNAL HAVING SPECIFIC FREQUENCY OR COMBINATIONS OF DC VALUE AND SINGLE TONE TESTING SIGNAL TO CALIBRATE IMPAIRMENTS IN TRANSMITTING SIGNAL

(75) Inventor: Ang-Sheng Lin, Kao-Hsiung (TW)

(73) Assignee: Mediatek Inc., Science Based Industrial Park, Hsin-Chu (TW)

( * ) Notice: Subject to any disclaimer, the term of this patent is extended or adjusted under 35 U.S.C. 154(b) by 834 days.

(21) Appl. No.: 11/609,309

(22) Filed: Dec. 11, 2006

(65) Prior Publication Data

US 2008/0037684 A1 Feb. 14, 2008

Related U.S. Application Data

(60) Provisional application No. 60/821,965, filed on Aug. 10, 2006.

(51) Int. Cl.
*H03C 3/00* (2006.01)

(52) U.S. Cl. .................. 375/302; 375/295; 375/303; 375/342; 375/354; 375/359; 455/69; 455/86; 455/302

(58) Field of Classification Search ............ 375/130, 375/135–137, 145–148, 150, 220, 243, 260, 375/267, 295, 306, 316, 343, 349, 354, 219, 375/342, 259, 299, 302, 304; 455/69, 86, 455/126, 302

See application file for complete search history.

(56) References Cited

U.S. PATENT DOCUMENTS

| | | | |
|---|---|---|---|
| 6,603,810 B1 * | 8/2003 | Bednekoff et al. ......... 375/228 |
| 6,760,577 B2 | 7/2004 | Li |
| 7,298,793 B2 * | 11/2007 | Wu et al. .................. 375/296 |
| 7,450,923 B2 * | 11/2008 | Dantoni et al. ............ 455/302 |
| 7,627,055 B2 * | 12/2009 | Coersmeier ............... 375/296 |
| 2006/0236188 A1 * | 10/2006 | Behzad et al. ............. 714/746 |
| 2007/0135058 A1 * | 6/2007 | Ma et al. .................... 455/69 |
| 2009/0227214 A1 * | 9/2009 | Georgantas et al. ......... 455/86 |
| 2009/0267701 A1 * | 10/2009 | Parsa et al. ................ 332/103 |

* cited by examiner

*Primary Examiner*—Shuwang Liu
*Assistant Examiner*—Hirdepal Singh
(74) *Attorney, Agent, or Firm*—Winston Hsu

(57) ABSTRACT

A communication system for determining a target calibration parameter for calibrating impairments in a transmission signal is disclosed. The communication system includes a carrier signal generator, a transmitting module, a testing signal generator, a power detection unit, and a calibration apparatus. The testing signal generator generates a first testing signal to the first transmitting path of the transmitting module or a second testing signal to the second transmitting path of the transmitting module according to a single tone signal having a specific frequency or according to combinations of a DC value and the single tone signal. The power detection unit detects power of components associated with the specific frequency in the transmission signal to generate a power indicating signal. The calibration apparatus applies a first candidate calibration parameter to reference a first power indicating signal corresponding to the first candidate calibration parameter to determine the target calibration parameter.

20 Claims, 7 Drawing Sheets

COMMUNICATION SYSTEM FOR UTILIZING SINGLE TONE TESTING SIGNAL HAVING SPECIFIC FREQUENCY OR COMBINATIONS OF DC VALUE AND SINGLE TONE TESTING SIGNAL TO CALIBRATE IMPAIRMENTS IN TRANSMITTING SIGNAL

CROSS REFERENCE TO RELATED APPLICATIONS

This application claims the benefit of U.S. Provisional Application No. 60/821,965, which was filed on Aug. 10, 2006 and is included herein by reference.

BACKGROUND

The present invention relates to a communication system, and more particularly, to a communication system for determining at least a target impairment calibration parameter for calibrating impairment in a transmission signal according to a single tone testing signal having a specific frequency or according to combinations of a DC value and the single tone signal.

In general, for a communication system (for example, a transceiver) to generate a transmitting signal, two factors, including carrier leakage and IQ imbalance, are considered when considering the performance of the communication system, where the carrier leakage and the IQ imbalance are usually called impairments for the communication system. In an ideal situation, the impairments are not introduced into the communication system; in reality, however, they often occur, resulting largely from non-ideal characteristics of electronic components or mismatches between electronic components or circuits. For example, when a local oscillator re-radiation from the antenna is produced, the DC offset introduced by carrier leakage is not desirable when performing an up-converting operation to generate the transmitting signal because the DC offset is also up-converted.

Additionally, the IQ imbalance is not desirable for the transmitting module's up-converting operation. The IQ imbalance includes gain imbalance and phase imbalance, wherein gain imbalance means a mismatch between gains of signals in the in-phase transmitting path and the quadrature-phase transmitting path, and phase imbalance means a mismatch between phases of carrier signals in the in-phase transmitting path and the quadrature-phase transmitting path. Specifically, because gains of signals in the in-phase transmitting path and the quadrature-phase transmitting path are not guaranteed to be identical and phases of carrier signals in the in-phase transmitting path and the quadrature-phase transmitting path are not guaranteed to be orthogonal, gain imbalance and phase imbalance must be considered.

Therefore, decreasing the influence caused by the above-mentioned impairments is very important when the transmitting module performs the up-converting operation. Usually, different calibration parameters are utilized for calibrating the transmitting paths to decrease the influence caused by the impairments, i.e. the carrier leakage and the IQ imbalance, such that the performance of the communication system is improved. Therefore, a novel and improved scheme for determining these calibration parameters efficiently is needed.

SUMMARY

One of the objectives of the present invention is to provide a communication system for determining at least a target impairment calibration parameter for calibrating impairments in a transmission signal according to a single tone testing signal having a specific frequency or according to combinations of a DC value and the single tone testing signal, to solve the above-mentioned problem.

According to the claimed invention, a communication system for determining at least a target carrier leakage calibration parameter for calibrating a carrier leakage in a transmission signal is disclosed. The communication system comprises a carrier signal generator, a transmitting module, a testing signal generator, a power detection unit, and a calibration apparatus. The carrier signal generator is utilized for generating a first carrier signal to a first transmitting path and a second carrier signal to a second transmitting path. The transmitting module having the first transmitting path and the second transmitting path is utilized for generating the transmission signal according to a single tone testing signal inputted to the first transmitting path, the first carrier signal, and the second carrier signal. The testing signal generator, coupled to the transmitting module, is used to generate the single tone testing signal having a specific frequency. The power detection unit is utilized for detecting power of components associated with the specific frequency in the transmission signal to generate a power indicating signal. Finally, the calibration apparatus, coupled to the transmitting module and the power detection unit, is utilized for applying at least a first candidate carrier leakage calibration parameter to the first transmitting path and referencing a first power indicating signal corresponding to the first candidate carrier leakage calibration parameter to determine a target carrier leakage calibration parameter of the first transmitting path.

According to the claimed invention, a communication system for determining at least a target imbalance calibration parameter for calibrating an IQ imbalance in a transmission signal is disclosed. The communication system comprises a carrier signal generator, a transmitting module, a testing signal generator, a power detection unit, and a calibration apparatus. The carrier signal generator is utilized for generating a first carrier signal to a first transmitting path and a second carrier signal to a second transmitting path; the transmitting module, coupled to the carrier signal generator and having the first transmitting path and the second transmitting path, is utilized for generating the transmission signal according to a first testing signal inputted to the first transmitting path, a second testing signal inputted to the second transmitting path, the first carrier signal, and the second carrier signal; the testing signal generator, coupled to the transmitting module, is utilized for generating the first testing signal and the second testing signal according to combinations of a DC value and a single tone signal having a specific frequency; the power detection unit, coupled to the transmitting module, detects power of components associated with the specific frequency in the transmission signal to generate a power indicating signal; and the calibration apparatus, coupled to the transmitting module and the power detection unit, applies at least a first candidate imbalance calibration parameter to the transmitting module and then references a first power indicating signal corresponding to the first candidate imbalance calibration parameter to determine the target imbalance calibration parameter.

According to the claimed invention, a communication method for determining at least a target carrier leakage calibration parameter for calibrating a carrier leakage in a transmission signal is disclosed. The communication method comprises: generating a first carrier signal to a first transmitting path and a second carrier signal to a second transmitting path; providing a transmitting module having the first transmitting path and the second transmitting path, and utilizing the transmitting module to generate the transmission signal according to a single tone testing signal inputted to the first transmitting path, the first carrier signal, and the second carrier signal; generating the single tone testing signal having a specific frequency; detecting power of components associated with the specific frequency in the transmission signal to generate a power indicating signal; and applying at least a first candidate carrier leakage calibration parameter to the first transmitting path and then referencing a first power indicating signal corresponding to the first candidate carrier leakage calibration parameter to determine a target carrier leakage calibration parameter of the first transmitting path.

According to the claimed invention, a communication method for determining at least a target imbalance calibration parameter for calibrating an IQ imbalance in a transmission signal is disclosed. The communication method comprises: generating a first carrier signal to a first transmitting path and a second carrier signal to a second transmitting path; providing a transmitting module having the first transmitting path and the second transmitting path to generate the transmission signal according to a first testing signal inputted to the first transmitting path, a second testing signal inputted to the second transmitting path, the first carrier signal, and the second carrier signal; generating the first testing signal and the second testing signal according to combinations of a DC value and a single tone signal having a specific frequency; detecting power of components associated with the specific frequency in the transmission signal to generate a power indicating signal; and applying at least a first candidate imbalance calibration parameter to the transmitting module and then referencing a first power indicating signal corresponding to the first candidate imbalance calibration parameter to determine the target imbalance calibration parameter.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
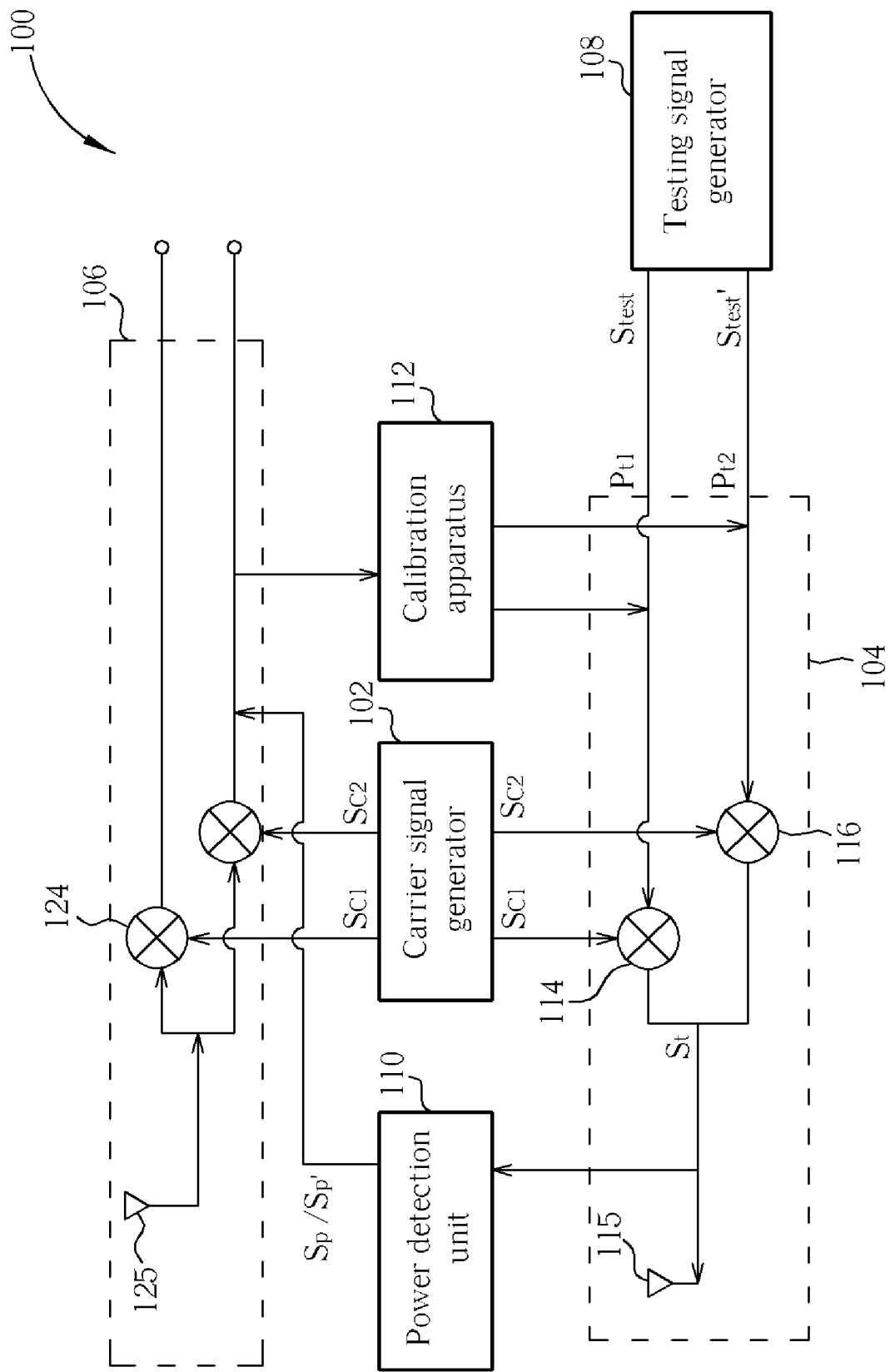
FIG. 1 is a diagram of a communication system according to an embodiment of the present invention.

Please refer to FIG. 1. FIG. 1 is a diagram of a communication system 100 according to an embodiment of the present invention. As shown in FIG. 1, the communication system 100 comprises a carrier signal generator 102, a transmitting module 104, a receiving module 106, a testing signal generator 108, a power detection unit 110, and a calibration apparatus 112. The carrier signal generator 102 is utilized for generating a first carrier signal $S_{c1}$ and a second carrier signal $S_{c2}$, wherein the first carrier signal $S_{c1}$ and the second carrier signal $S_{c2}$ are ideally mutually orthogonal. The transmitting module 104, having a first transmitting path $P_{t1}$ and a second transmitting path $P_{t2}$, is used to generate the transmitting signal $S_t$, which is outputted via an antenna 115, according to a single tone testing signal inputted to the first or second transmitting path (i.e. $P_{t1}/P_{t2}$), the first carrier signal $S_{c1}$ inputted to a mixer 114, and the second carrier signal $S_{c2}$ inputted to a mixer 116 to calibrate the carrier leakage. The receiving module 106 has an antenna 125 to receive the transmitting signal $S_t$ outputted by the transmitting module 104 and down-converts the received transmitting signal $S_t$ using mixers 124, 126.

In this embodiment, when the carrier leakage is under calibration, the testing signal generator 108 adopts a single tone testing signal to set only one of the testing signals $S_{test}$, $S_{test}'$. For instance, the single tone testing signal having a specific frequency (i.e. the testing signal $S_{test}$) is inputted into the first transmitting path $P_{t1}$ and the testing signal $S_{test}'$ is zero when calibrating the DC offset in the first transmitting path $P_{t1}$; otherwise, the testing signal $S_{test}$ is zero and the single tone testing signal (i.e. the testing signal $S_{test}'$) is inputted into the second transmitting path $P_{t2}$ when calibrating the DC offset in the second transmitting path $P_{t2}$. In addition, the transmitting module 104 is further used to generate the transmitting signals $S_t$ according to the testing signal $S_{test}$ inputted to the first transmitting path $P_{t1}$, the testing signal $S_{test}'$ inputted to the second transmitting path $P_{t2}$, the first carrier signal $S_{c1}$, and the second carrier signal $S_{c2}$ to calibrate the IQ imbalance (i.e. the gain imbalance and the phase imbalance). In this embodiment, when the IQ imbalance is under calibration, the testing signal generator 108 adopts combinations of a DC value and a single tone testing signal to set the testing signals $S_{test}$, $S_{test}'$.

The power detection unit 110 detects power of components associated with the specific frequency in the transmission signals $S_t$ to generate at least a first/second power indicating signals $S_p/S_p'$. The calibration apparatus 112 applies at least a candidate calibration parameter to the first transmitting path $P_{t1}$ or to the second transmitting path $P_{t2}$ and references at least the first/second power indicating signal $S_p/S_p'$ corresponding to the candidate calibration parameter to determine a target calibration parameter when calibrating the carrier leakage or IQ imbalance; further descriptions are detailed later. Please note that, in this embodiment, the first transmitting path $P_{t1}$ means an in-phase transmitting path and the second transmitting path $P_{t2}$ means a quadrature-phase transmitting path. In this embodiment, the calibration apparatus 112 is a digital circuit. As known to those skilled in this art, the receiving module 106 itself contains analog-to-digital converters (not shown in FIG. 1). Therefore, with the help of analog-to-digital converters in the receiving module 106, the calibration apparatus 112 is able to process the first/second power indicating signals $S_p$/$S_p'$.

For calibrating DC offsets caused by the carrier leakage, procedures of calibrating DC offsets in the first transmitting path $P_{t1}$ and in the second transmitting path $P_{t2}$ are separated in this embodiment. When calibrating the DC offset in the first transmitting path $P_{t1}$, the testing signal generator 108 generates the single tone testing signal, having the specific frequency, to the first transmitting path $P_{t1}$ and does not generate any signal to the second transmitting path $P_{t2}$. The calibration apparatus 112 applies a first candidate carrier leakage calibration parameter to the first transmitting path $P_{t1}$ for trying to calibrate the DC offset in the first transmitting path $P_{t1}$. The transmitting module 104 generates the transmitting signal $S_t$ according to the first carrier signal $S_{c1}$, the single tone testing signal (i.e. the testing signal $S_{test}$), and a residual DC offset value generated from a current DC offset calibrated by the first candidate carrier leakage calibration parameter. The transmitting signal $S_t$ can be represented as follows:

$$S_t = [\{DC_{1\_calibrated} + \cos(\omega_{BB}t)\} \cdot G \cdot \cos(\omega_{LO}t + \tfrac{1}{2}\theta_{RF}) + \{DC_2\} \cdot \sin(\omega_{LO}t - \tfrac{1}{2}\theta_{RF})] \quad \text{Equation (1)}$$

wherein $DC_{1\_calibrated}$ means the residual DC offset value in the first transmitting path $P_{t1}$, being a result of calibrating the DC offset using the first candidate carrier leakage calibration parameter, and $DC_2$ means a DC offset in the second transmitting path $P_{t2}$; the frequency $\omega_{BB}$ is the specific frequency of the single tone testing signal and the frequency $\omega_{LO}$ is the frequency of the first and second carrier signals. Suppose that the single tone testing signal is represented by $\cos(\omega_{BB}t)$, the first carrier signal is represented by $\cos(\omega_{LO}t)$, and the second carrier signal is represented by $\sin(\omega_{LO}t)$. The gain G is a gain imbalance between the first transmitting path $P_{t1}$ and the second transmitting path $P_{t2}$, and the phase $\theta_{RF}$ is a phase imbalance between the first transmitting path $P_{t1}$ and the second transmitting path $P_{t2}$.

After receiving the transmitting signal $S_t$, the power detection unit 110 takes the square of the transmitting signal $S_t$, and performs a DC blocking operation and a low-pass filtering upon the square of the transmitting signal $S_t$ to detect components associated with the specific frequency $\omega_{BB}$ in the transmitting signal $S_t$ to thereby generate the first power indicating signal $S_p$. Ideally, after the DC blocking operation and the low-pass filtering, no component related to the specific frequency $\omega_{BB}$ in the transmitting signal $S_t$ can be detected; that is to say, the first power indicating signal $S_p$ is zero; in practice, however, the first power indicating signal $S_p$ is not zero, and is detected by the power detection unit 110. The first power indicating signal $S_p$ can be represented as the following:

$$S_p = (DC_{1\_calibrated}) \cdot \cos(\omega_{BB}t) \cdot G^2 + (DC_2) \cdot \sin(\theta_{RF}) \cos(\omega_{BB}t) \cdot G = \cos(\omega_{BB}t) \cdot G \cdot (DC_{1\_calibrated} \cdot G + DC_2 \cdot \sin(\theta_{RF})) \quad \text{Equation (2)}$$

Because it is impossible for both values of the signal $\cos(\omega_{BB}t)$ and the gain imbalance G in Equation (2) to be equal to zero, the only way to minimize the first power indicating signal $S_p$ is to apply different first candidate carrier leakage calibration parameters respectively to result in different residual DC offset values in the first transmitting path $P_{t1}$ (i.e. $DC_{1\_calibrated}$) to generate different first power indicating signals $S_p$. The calibration apparatus 112 then searches for a specific first power indicating signal that has a minimum power value from the gathered first power indicating signals $S_p$ and determines the specific first candidate carrier leakage calibration parameter corresponding to the specific first power indicating signal as the target carrier leakage calibration parameter of the first transmitting path $P_{t1}$, i.e. $DC_{1\_target}$.

After determining the target carrier leakage calibration parameter of the first transmitting path $P_{t1}$ (i.e. $DC_{1\_target}$), the DC offset in the second transmitting path $P_{t2}$ is then considered for calibration. The testing signal generator 108 generates the single tone testing signal to the second transmitting path $P_{t2}$ instead of generating the single tone testing signal to the first transmitting path $P_{t1}$, and the calibration apparatus 112 applies the target carrier leakage calibration parameter of the first transmitting path $P_{t1}$ (i.e. $DC_{1\_target}$) and further applies various second candidate carrier leakage calibration parameters to the second transmitting path $P_{t2}$. The calibration process applied to the first transmitting path $P_{t2}$ is similar to that applied to the first transmitting path $P_{t1}$. The transmitting module 104 generates different transmitting signals $S_t$ respectively according to the second carrier signal $S_{c2}$, the single tone testing signal inputted to the second transmitting path $P_{t2}$ (i.e. the testing signal $S_{test}'$), the target carrier leakage calibration parameter of the first transmitting path $P_{t1}$ (i.e. $DC_{1\_target}$), and the second candidate carrier leakage calibration parameters inputted to the second transmitting path $P_{t2}$. Similarly, the power detection unit 110 takes the square of each of the transmitting signals $S_t$, and performs the DC blocking operation and the low-pass filtering upon the square of each of the transmitting signals $S_t$ to detect components associated with the specific frequency $\omega_{BB}$ in each transmitting signal $S_t$ to generate a plurality of second power indicating signals $S_p'$. The calibration apparatus 112 then searches for a specific second power indicating signal that has a minimum power value from the gathered second power indicating signals $S_p'$ and determines the specific second candidate carrier leakage calibration parameter corresponding to the specific second power indicating signal as the target carrier leakage calibration parameter of the second transmitting path $P_{t2}$. Since the above-mentioned operation of calibrating the DC offset in the second transmitting path $P_{t2}$ is similar to that applied to calibrating the DC offset in the first transmitting path $P_{t1}$, further description is omitted for brevity.

Figure 2:
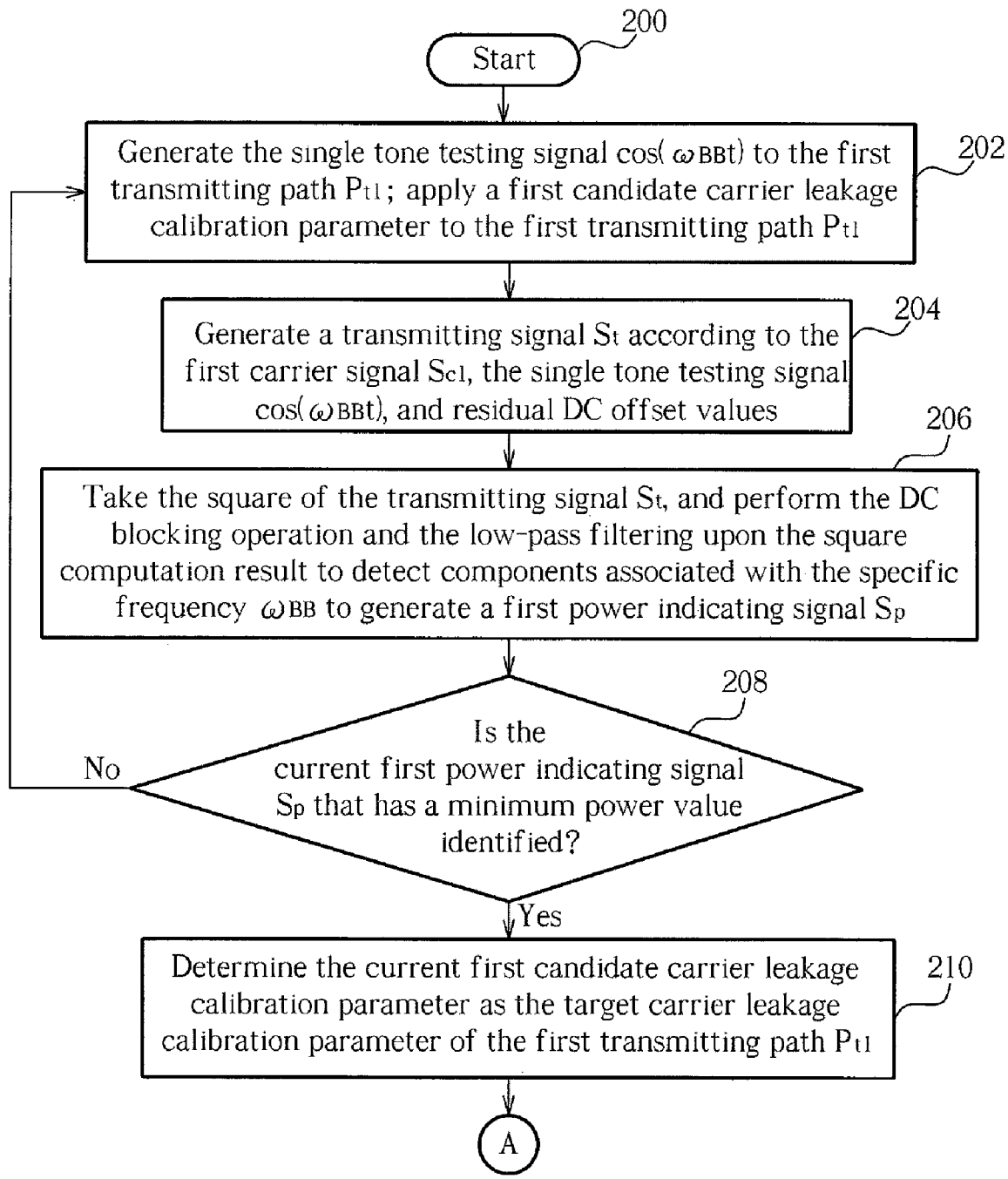
FIG. 2 is a flowchart of calibrating DC offsets introduced by the carrier leakage in the communication system according to an embodiment of the present invention.
Figure 3:
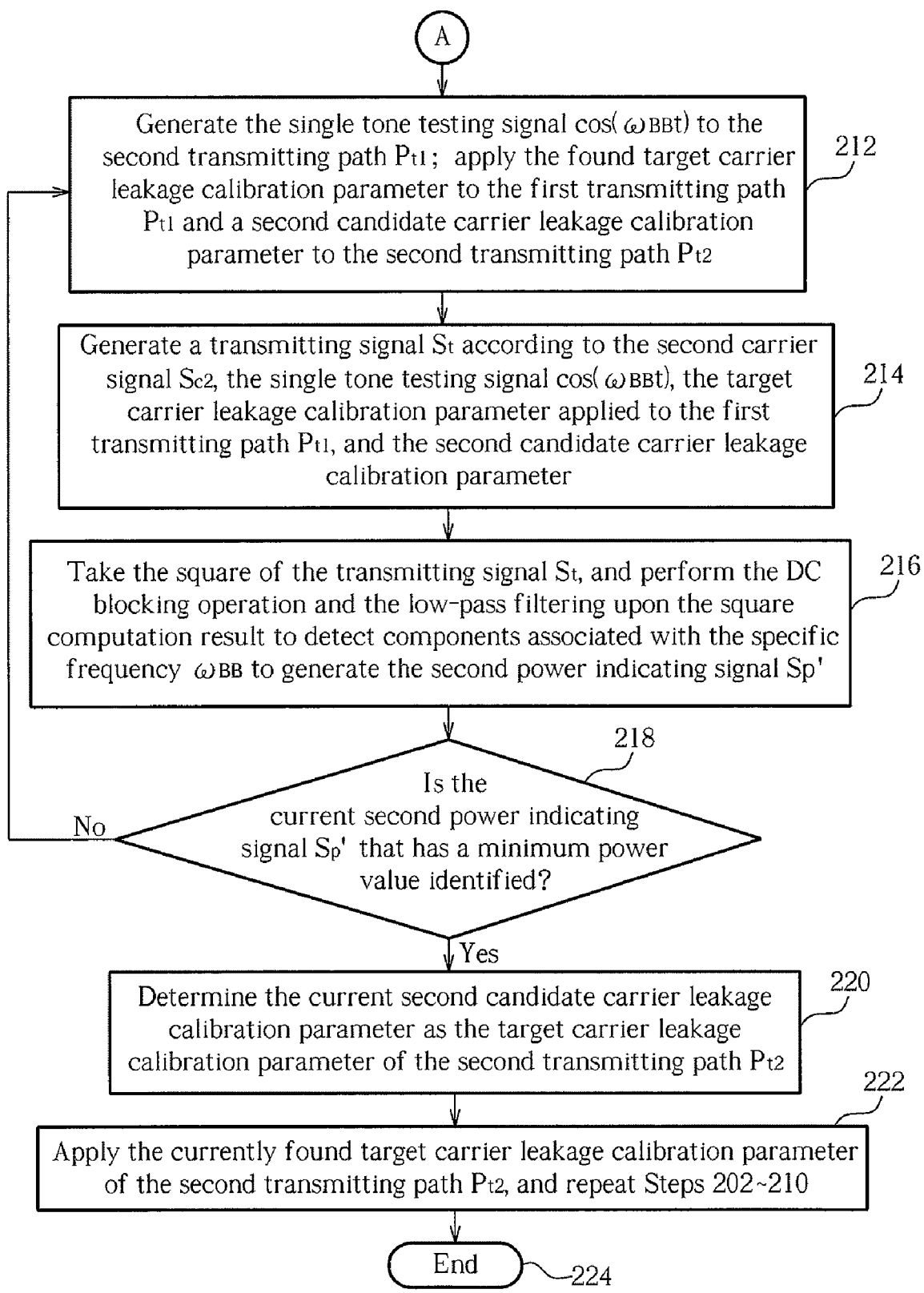
FIG. 3 is a flowchart continuing the above-mentioned procedure of calibrating DC offsets.

Please refer to FIG. 2 and FIG. 3. FIG. 2 is a flowchart of calibrating DC offsets introduced by the carrier leakage in the communication system 100 according to an embodiment of the present invention. FIG. 3 is a flowchart continuing the above-mentioned procedure of calibrating DC offsets. The steps for calibrating DC offsets caused by the carrier leakage are shown as follows:

Step 200: The communication system 100 is started.

Step 202: The testing signal generator 108 generates the single tone testing signal $\cos(\omega_{BB}t)$, having the specific frequency $\omega_{BB}$, to the first transmitting path $P_{t1}$, and the calibration apparatus 112 applies a first candidate carrier leakage calibration parameter to the first transmitting path $P_{t1}$ to calibrate the DC offset in the first transmitting path $P_{t1}$.

Step 204: The transmitting module 104 generates a transmitting signal $S_t$ according to the first carrier signal $S_{c1}$, the single tone testing signal $\cos(\omega_{BB}t)$, and residual DC offset values generated from a current DC offset calibrated by the first candidate carrier leakage calibration parameter.

Step 206: The power detection unit 110 takes the square of the different transmitting signal $S_t$, and performs the DC blocking operation and the low-pass filtering upon the square computation result to detect components associated with the specific frequency $\omega_{BB}$ in the transmitting signal $S_t$ to thereby generate a first power indicating signal $S_p$.

Step 208: Does the calibration apparatus 112 identify that the current first power indicating signal $S_p$ has a minimum power value among gathered first power indicating signals? If yes, go to Step 210; otherwise, go to Step 202 for applying another first candidate carrier leakage calibration parameter to the first transmitting path $P_{t1}$.

Step 210: The calibration apparatus 112 determines the current first candidate carrier leakage calibration parameter corresponding to the current first power indicating signal $S_p$ as the target carrier leakage calibration parameter of the first transmitting path $P_{t1}$, i.e. $DC_{1\_target}$.

Step 212: The testing signal generator 108 generates the single tone testing signal $\cos(\omega_{BB}t)$ to the second transmitting path $P_{t1}$ instead, and the calibration apparatus 112 applies the found target carrier leakage calibration parameter of the first transmitting path $P_{t1}$ (i.e. $DC_{1\_target}$) to the first transmitting path $P_{t1}$ and a second candidate carrier leakage calibration parameter to the second transmitting path $P_{t2}$ to calibrate the DC offset in the second transmitting path $P_{t2}$.

Step 214: The transmitting module 104 generates a transmitting signal $S_t$ according to the second carrier signal $S_{c2}$, the single tone testing signal $\cos(\omega_{BB}t)$ inputted to the second transmitting path $P_{t2}$, the target carrier leakage calibration parameter applied to the first transmitting path $P_{t1}$ (i.e. $DC_{1\_target}$), and the second candidate carrier leakage calibration parameter inputted to the second transmitting path $P_{t2}$.

Step 216: The power detection unit 110 takes the square of the transmitting signal $S_t$, and performs the DC blocking operation and the low-pass filtering upon the square computation result to detect components associated with the specific frequency $\omega_{BB}$ in the transmitting signal $S_t$ to thereby generate the second power indicating signal $S_p'$.

Step 218: Does the calibration apparatus 112 identify that the current second power indicating signal $S_p'$ has a minimum power value among gathered second power indicating signals? If yes, go to Step 220; otherwise, go to Step 212 for applying another second candidate carrier leakage calibration parameter to the second transmitting path $P_{t2}$.

Step 220: The calibration apparatus 112 determines the current second candidate carrier leakage calibration parameter corresponding to the current second power indicating signal as the target carrier leakage calibration parameter of the second transmitting path $P_{t2}$.

Step 222: Apply the currently found target carrier leakage calibration parameter of the second transmitting path $P_{t2}$, and then repeat Steps 202~210 to calibrate the DC offset in the first transmitting path $P_{t1}$ again.

Step 224: End.

As mentioned above, in Step 222, repeating Steps 202~210 to calibrate the DC offset in the first transmitting path $P_{t1}$ again ensures that the DC offset in the first transmitting path $P_{t1}$ can be calibrated more accurately. This is because the procedure of calibrating the DC offset in the first transmitting path $P_{t1}$ operates first and the target carrier leakage calibration parameter of the first transmitting path $P_{t1}$ (i.e. $DC_{1\_target}$) is related to the DC offset in the second transmitting path $P_{t2}$ (i.e. $DC_2$) shown in Equation (2). Similarly, the DC offset in the second transmitting path $P_{t2}$ can be calibrated again by repeating Steps 212-220. In addition, the number of times of re-calibrating the DC offsets in the first transmitting path $P_{t1}$ and the second transmitting path $P_{t2}$ is programmable according to design requirements. It should be noted that repeating the calibration of DC offset in the first transmitting path $P_{t1}$/second transmitting path $P_{t2}$ is optional and is not meant to be a limitation of the present invention. In other words, without the above re-calibration procedures, utilizing the target carrier leakage calibration parameters found in steps 210 and 220 can also achieve the objective of calibrating the DC offsets existing in the first and second transmitting paths $P_{t1}$ and $P_{t2}$. Furthermore, in this embodiment, the procedure of calibrating the DC offset in the second transmitting path $P_{t2}$ can be executed first, and this still obeys the spirit of the present invention. Please note that any extreme value searching scheme can be utilized to locate a specific power indicating signal having a minimum power value. The extreme value searching schemes shown in FIG. 2 and FIG. 3 are only for illustrative purposes. For example, the calibration apparatus 112 outputs a plurality of carrier leakage calibration parameters sequentially, and obtains a plurality of corresponding power indicating signals from the power detection unit 110. Then, the calibration apparatus 112 starts searching the desired target carrier leakage calibration parameter utilizing information given by these gathered power indicating signals.

As to calibrating the gain imbalance between the first and second transmitting paths $P_{t1}$, $P_{t2}$, the testing signal generator 108 generates the testing signal $S_{test}$ to the first transmitting path $P_{t1}$ and the testing signal $S_{test}'$ to the second transmitting path $P_{t2}$, wherein the testing signals $S_{test}$, $S_{test}'$ are combinations of a DC value and a single tone testing signal having a specific frequency. The testing signal $S_{test}$, $S_{test}'$ can be represented as follows:

$$S_{test} = \alpha + \beta \cos(\omega_{BB}t), S_{test}' = \alpha - \beta \cos(\omega_{BB}t) \qquad \text{Equation (3)}$$

In Equation (3), $\alpha$ represents the DC value, and $\beta \cos(\omega_{BB}t)$ represents the single tone testing signal. The calibration apparatus 112 applies a first candidate gain imbalance calibration parameter to the transmitting module 104, and the transmitting module 104 generates the transmitting signal $S_t$ to the power detection unit 110 according to the testing signal $S_{test}$, the testing signal $S_{test}'$, the first carrier signal $S_{c1}$, the second carrier signal $S_{c2}$, and calibrated gain value due to the first candidate gain imbalance calibration parameter. The power detection unit 110 takes the square of the transmitting signal $S_t$ and performs a DC blocking operation and low-pass filtering upon the square of the transmitting signal $S_t$ to generate the first power indicating signal $S_p$. The transmitting signal $S_t$ and the first power indicating signal $S_p$ are represented as follows:

$$S_t = \left(1 - \frac{\Delta G_{calibrated}}{2}\right) \cdot \{\alpha + \beta\cos(\omega_{BB}t) + DC_1\} \cdot \qquad \text{Equation (4)}$$
$$\cos\left(\omega_{LO}t + \frac{\theta_{RF}}{2}\right) + \left(1 + \frac{\Delta G_{calibrated}}{2}\right) \cdot$$
$$\{\alpha - \beta\cos(\omega_{BB}t) + DC_2\} \cdot \sin\left(\omega_{LO}t + \frac{\theta_{RF}}{2}\right)$$

-continued $$S_p = \left(1 - \frac{\Delta G_{calibrated}}{2}\right)^2 \cdot \{(\alpha + DC_1) \cdot \beta\cos(\omega_{BB}t)\} \cdot \left(\frac{1}{2}\right) + \left(1 + \frac{\Delta G_{calibrated}}{2}\right)^2 \cdot \{(\alpha + DC_2) \cdot [-\beta\cos(\omega_{BB}t)]\}\left(\frac{1}{2}\right) + \left(1 - \frac{\Delta G_{calibrated}^2}{4}\right) \cdot \left(\frac{1}{2}\right)\sin(\theta_{RF}) \cdot (2\alpha + DC_1 + DC_2) \cdot \beta\cos(\omega_{BB}t)$$

$$\cong \left(\frac{1}{2}\right) \cdot \left[\left(1 - \frac{\Delta G_{calibrated}}{2}\right)^2 \cdot \{(\alpha + DC_1) \cdot \beta\cos(\omega_{BB}t)\} + \left(1 + \frac{\Delta G_{calibrated}}{2}\right)^2 \cdot \{(\alpha + DC_2) \cdot [-\beta\cos(\omega_{BB}t)]\}\right]$$

$$\cong \left(\frac{1}{2}\right) \cdot [(1 - \Delta G_{calibrated}) \cdot \{(\alpha + DC_1) \cdot \beta\cos(\omega_{BB}t)\} + (1 + \Delta G_{calibrated}) \cdot \{(\alpha + DC_2) \cdot [-\beta\cos(\omega_{BB}t)]\}]$$

$$= \left(\frac{1}{2}\right) \cdot \beta\cos(\omega_{BB}t) \cdot \{(1 - \Delta G_{calibrated}) \cdot (\alpha + DC_1) - (1 + \Delta G_{calibrated}) \cdot (\alpha + DC_2)\}$$

$$= \left(\frac{1}{2}\right) \cdot \beta\cos(\omega_{BB}t) \cdot \{DC_1 - DC_2 - \Delta G_{calibrated}(2\alpha + DC_1 + DC_2)\}$$

Equation (5)

In Equations (4) and (5), $\Delta G_{calibrated}$ represents a calibrated gain imbalance between the first and second transmitting paths $P_{t1}$, $P_{t2}$, and $DC_1$, $DC_2$ represents the DC offsets in the first and second transmitting paths $P_{t1}$, $P_{t2}$. In Equation (4), influences of the DC offsets and phase imbalance are still considered in order to make Equation (4) more accurate, since only gain imbalance is calibrated. In Equation (5), the term related to $\sin(\theta_{RF})$ is able to be reduced since $\sin(\theta_{RF})$ is small enough; $(1-\Delta G_{calibrated}/2)^2$ can also be approximated to $(1-\Delta G_{calibrated})$. Therefore, only the term, related to $(DC_1-DC_2-\Delta G_{calibrated}(2\alpha+DC_1+DC_2))$, finally exists in Equation (5). Ideally, based on the result of Equation (5), the first power indicating signal $S_p$ should be zero; however, in practice, the DC offsets in the first and second transmitting paths $P_{t1}$, $P_{t2}$ (i.e. $DC_1$, $DC_2$) and the calibrated gain imbalance $\Delta G_{calibrated}$ are not zero. This makes the first power indicating signal $S_p$ not equal to zero. The calibration apparatus 112 will apply different first candidate gain imbalance calibration parameters to the transmitting module 104 to generate different transmitting signals $S_t$. The power detection unit 110 generates different first power indicating signals $S_p$ to the receiving module 106 according to the different transmitting signals $S_t$. The calibration apparatus 112 receives the different first power indicating signals $S_p$ through the receiving module 106, and discovers a specific first power indicating signal having a minimum power value from the gathered first power indicating signals to determine the target gain imbalance calibration parameter according to a specific first candidate gain imbalance calibration parameter corresponding to the specific first power indicating signal; the above-mentioned target gain imbalance calibration parameter is recorded as a gain value $G_{target}$.

After the gain value $G_{target}$ is determined, the testing signal generator 108 updates the testing signal $S_{test}$ inputted to the first transmitting path $P_{t1}$ and the testing signal $S_{test}'$ inputted to the second transmitting path $P_{t2}$, where the updated testing signals are still combinations of the DC value $\alpha$ and the single tone testing signal $\beta \cos(\omega_{BB}t)$ having the specific frequency $\omega_{BB}$. At this time, the testing signals $S_{test}$, $S_{test}'$ can be represented as follows:

$$S_{test} = -\alpha + \beta \cos(\omega_{BB}t), S_{test}' = -\alpha - \beta \cos(\omega_{BB}t) \quad \text{Equation (6)}$$

The calibration apparatus 112 applies different second candidate gain imbalance calibration parameters to the transmitting module 104. The transmitting module 104 generates different transmitting signals $S_t$ according to the first carrier signal $S_{c1}$, the second carrier signal $S_{c2}$, the updated testing signal $S_{test}$, the updated testing signal $S_{test}'$, and different second candidate gain imbalance calibration parameters. The power detection unit 110 generates different second power indicating signals $S_p'$ to the receiving module 106 according to the different transmitting signals $S_t$. The calibration apparatus 112 receives the different second power indicating signals $S_p'$ through the receiving module 106, and discovers a specific second power indicating signal having a minimum power value from the second power indicating signals $S_p'$ to determine the target gain imbalance calibration parameter according to a specific second candidate gain imbalance calibration parameter corresponding to the specific second power indicating signal; the above-mentioned target gain imbalance calibration parameter is recorded as another gain value $G_{target}'$. Because the procedure of obtaining the target gain imbalance calibration parameter $G_{target}'$ is similar to that of obtaining the target gain imbalance calibration parameter $G_{target}$, further description is omitted for brevity.

In Equation (5), since the value $\alpha$ is much larger than a summation of the DC offsets in the first and second transmitting paths $P_{t1}$, $P_{t2}$ (i.e. $DC_1$, $DC_2$), the result of Equation (5) can be approximated as the following:

$$S_p = (\tfrac{1}{2}) \cdot \beta \cos(\omega_{BB}t) \cdot \{DC_1 - DC_2 - \Delta G_{calibrated} \times 2\alpha\} \quad \text{Equation (7)}$$

wherein the value $DC_1 - DC_2$ is called an ideally minimum value when calibrating the gain imbalance. Similarly, the second power indicating signal $S_p'$ can also be represented as the following:

$$S_p' = (\tfrac{1}{2}) \cdot \beta \cos(\omega_{BB}t) \cdot \{DC_1 - DC_2 + \Delta G_{calibrated} \times 2\alpha\} \quad \text{Equation (8)}$$

Because a difference between the first and second power indicating signals $S_p$, $S_p'$ is only the sign of a value $\Delta G_{calibrated} \times 2\alpha$, the calibration apparatus 112 can calculate an average of the gain values $G_{target}$, $G_{target}'$ to be a better target gain imbalance calibration parameter. Therefore, after the gain value $G_{target}'$ is obtained, the calibration apparatus 112 calculates an average of the specific first candidate gain imbalance calibration parameter (i.e. the gain value $G_{target}$) and the specific second candidate gain imbalance calibration parameter (i.e. the gain value $G_{target}'$) to be the final target gain imbalance calibration parameter. However, applying only the gain value $G_{target}$ or $G_{target}'$ for gain calibration is also able to calibrate the gain imbalance. This also obeys the spirit of the present invention.

As to calibrating the phase imbalance between the first and second transmitting paths $P_{t1}$, $P_{t2}$, the testing signal generator 108 generates the testing signal $S_{test}$ to the first transmitting path $P_{t1}$ and another testing signal $S_{test}'$ to the second transmitting path $P_{t2}$, wherein the testing signals are either one of the DC value $\alpha$ and the single tone testing signal $\beta \cos(\omega_{BB}t)$ having a specific frequency $\omega_{BB}$. The testing signals $S_{test}$, $S_{test}'$ can be represented as follows:

$$S_{test} = \alpha, S_{test}' = \beta \cos(\omega_{BB}t) \quad \text{Equation (9)}$$

The calibration apparatus 112 applies a first candidate phase imbalance calibration parameter to the transmitting module 104, and the transmitting module 104 generates the transmitting signal $S_t$ to the power detection unit 110 according to the testing signal $S_{test}$, the testing signal $S_{test}'$, the first carrier signal $S_{c1}$, the second carrier signal $S_{c2}$, and a calibrated phase value due to the first candidate phase imbalance calibration parameter. The power detection unit 110 takes the square of the transmitting signal $S_t$ to detect a power level of the transmitting signal $S_t$ and performs the DC blocking operation and low-pass filtering upon the square of the transmitting signal $S_t$ to generate the first power indicating signal $S_p$. The transmitting signal $S_t$ and the first power indicating signal $S_p$ are represented as follows:

$$S_t = \{\alpha + DC_1\} \cdot \Delta G \cdot \cos\left(\omega_{LO} t + \frac{1}{2} \cdot \theta_{RF\_calibrated}\right) + \quad \text{Equation (10)}$$
$$\{\beta\cos(\omega_{BB}t) + DC_2\} \cdot \sin\left(\omega_{LO}t - \frac{1}{2} \cdot \theta_{RF\_calibrated}\right)$$

$$S_p = \beta \cdot DC_2 \cdot \cos\omega_{BB}t + (\alpha + DC_1) \cdot (\beta\cos\omega_{BB}t) \cdot \quad \text{Equation (11)}$$
$$\Delta G \cdot \left(\frac{1}{2}\right) \cdot \sin(\theta_{RF\_calibrated})$$
$$= \left\{DC_2 + (\alpha + DC_1) \cdot \Delta G \cdot \left(\frac{1}{2}\right) \cdot \sin(\theta_{RF\_calibrated})\right\} \cdot$$
$$\beta \cdot \cos\omega_{BB}t$$

In Equations (10) and (11), $\theta_{RF\_calibrated}$ represents a calibrated phase imbalance between the first and second transmitting paths $P_{t1}$, $P_{t2}$, and $DC_1$, $DC_2$ are the DC offsets in the first and second transmitting paths $P_{t1}$, $P_{t2}$ respectively. In Equation (10), influences of the DC offsets and gain imbalance are still considered in order to make Equation (10) more accurate. Ideally, based on the result of Equation (11), the first power indicating signal $S_p$ should be zero; however, in practice, the DC offsets in the first and second transmitting paths $P_{t1}$, $P_{t2}$ (i.e. $DC_1$, $DC_2$), the gain imbalance $\Delta G$, and the calibrated phase imbalance $\theta_{RF\_calibrated}$ are not zero. This makes the first power indicating signal $S_p$ not equal to zero. The calibration apparatus 112 will apply various first candidate phase imbalance calibration parameters to the transmitting module 104 to generate different transmitting signals $S_t$. The power detection unit 110 generates different first power indicating signals $S_p$ into the receiving module 106 according to the different transmitting signals $S_t$. The calibration apparatus 112 receives the first power indicating signals $S_p$ through the receiving module 106, and discovers a specific first power indicating signal having a minimum power value from the gathered first power indicating signals to determine the target phase imbalance calibration parameter according to a specific first candidate phase imbalance calibration parameter corresponding to the specific first power indicating signal; the above-mentioned target phase imbalance calibration parameter is recorded as a phase value $\theta_{target}$.

After the phase value $\theta_{target}$ is obtained, the testing signal generator 108 updates the testing signal $S_{test}$ inputted to the first transmitting path $P_{t1}$ and the testing signal $S_{test}'$ inputted to the second transmitting path $P_{t2}$, wherein the updated testing signals $S_{test}$, $S_{test}'$ are either one of the DC value $\alpha$ and the single tone testing signal $\beta \cos(\omega_{BB}t)$ having the specific frequency $\omega_{BB}$. At this time, the updated testing signals $S_{test}$, $S_{test}'$ can be represented as follows:

$$S_{test} = -\alpha, S_{test}' = \beta \cos(\omega_{BB}t) \quad \text{Equation (12)}$$

The calibration apparatus 112 applies various second candidate phase imbalance calibration parameters to the transmitting module 104. The transmitting module 104 generates different transmitting signals $S_t$ according to the first carrier signal $S_{c1}$, the second carrier signal $S_{c2}$, the updated testing signal $S_{test}$, the updated testing signal $S_{test}'$, and various second candidate phase imbalance calibration parameters. The power detection unit 110 generates different second power indicating signals $S_p'$ to the receiving module 106 according to the different transmitting signals $S_t$. The calibration apparatus 112 receives the different second power indicating signals $S_p'$ through the receiving module 106, and discovers a specific second power indicating signal having a minimum power value from the second power indicating signals $S_p'$ to determine the target phase imbalance calibration parameter according to a specific second candidate phase imbalance calibration parameter corresponding to the specific second power indicating signal; the above-mentioned target phase imbalance calibration parameter is recorded as another phase value $\theta_{target}'$. Because the procedure of obtaining the target phase imbalance calibration parameter $\theta_{target}'$ is similar to that of obtaining the target phase imbalance calibration parameter $\theta_{target}$, further description is omitted for brevity.

In Equation (11), since the DC value $\alpha$ is much larger than the DC offset $DC_1$, the result of Equation (11) can be approximated as the following:

$$S_p = \{DC_2 + \alpha \cdot \Delta G \cdot (\frac{1}{2}) \cdot \sin(\theta_{RF\_calibrated})\} \cdot \beta \cdot \cos \omega_{BB}t \quad \text{Equation (13)}$$

wherein the value $DC_2$ is called an ideally minimum value when calibrating the phase imbalance. Similarly, the second power indicating signal $S_p'$ can also be represented as the following:

$$S_p' = \{DC_2 - \alpha \cdot \Delta G \cdot (\frac{1}{2}) \cdot \sin(\theta_{RF\_calibrated})\} \cdot \beta \cdot \cos \omega_{BB}t \quad \text{Equation (14)}$$

Because a difference between the first and second power indicating signals $S_p$, $S_p'$ is only the sign of a value $\alpha \times \Delta G \times (\frac{1}{2}) \times \sin(\theta_{RF\_calibrated})$, the calibration apparatus 112 can calculate an average of the phase values $\theta_{target}$, $\theta_{target}'$ to be a better target phase imbalance calibration parameter. Therefore, after the phase value $\theta_{target}'$ is determined, the calibration apparatus 112 calculates an average of the specific first candidate phase imbalance calibration parameter (i.e. the phase value $\theta_{target}$) and the specific second candidate phase imbalance calibration parameter (i.e. the phase value $\theta_{target}'$) to be the final target phase imbalance calibration parameter. However, applying only the phase value $\theta_{target}$ or $\theta_{target}'$ for phase calibration can also calibrate the phase imbalance. This also obeys the spirit of the present invention.

Figure 4:
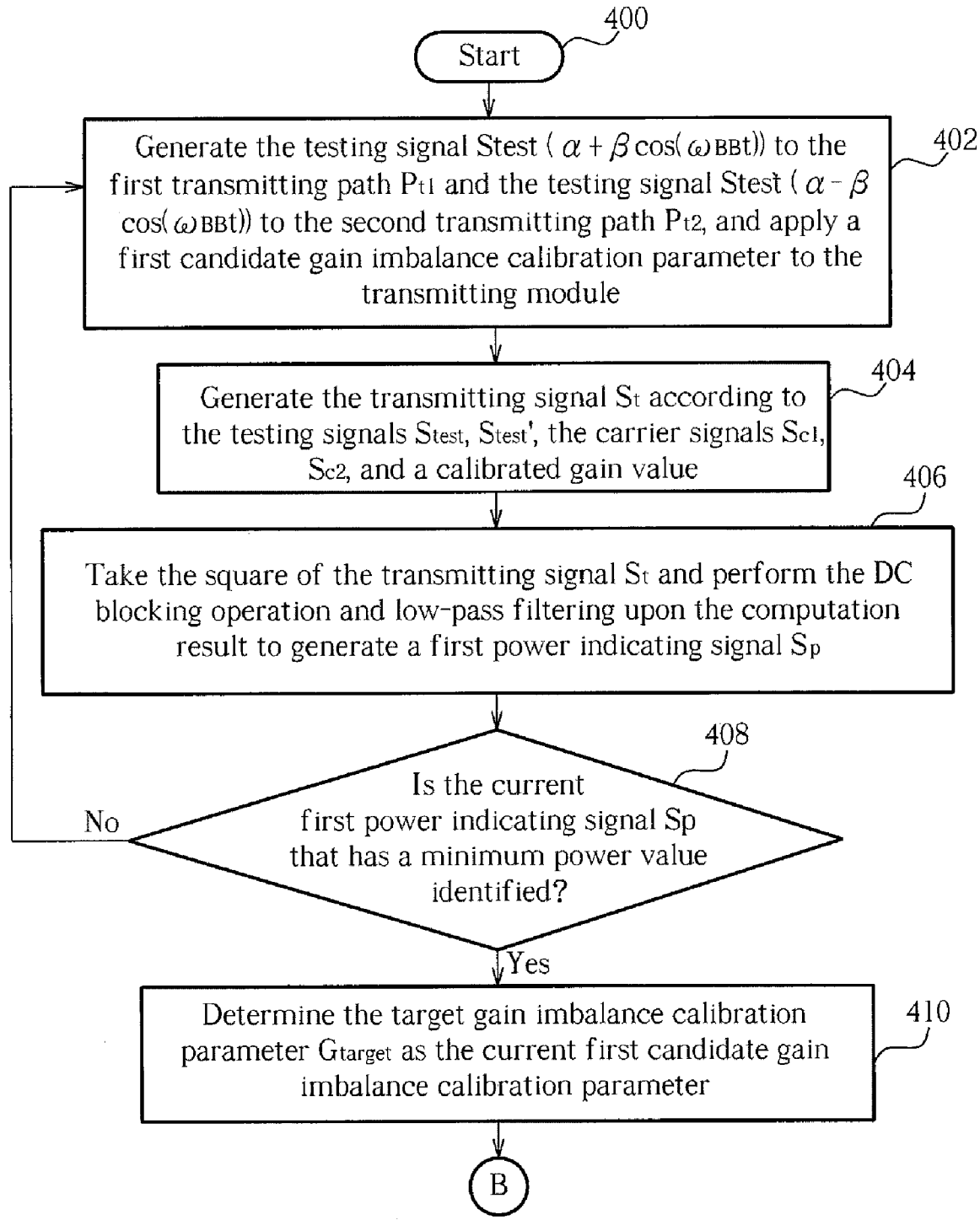
FIG. 4 is a flowchart of calibrating the IQ imbalance (comprising the gain imbalance and phase imbalance) in the communication system according to an embodiment of the present invention.
Figure 5:
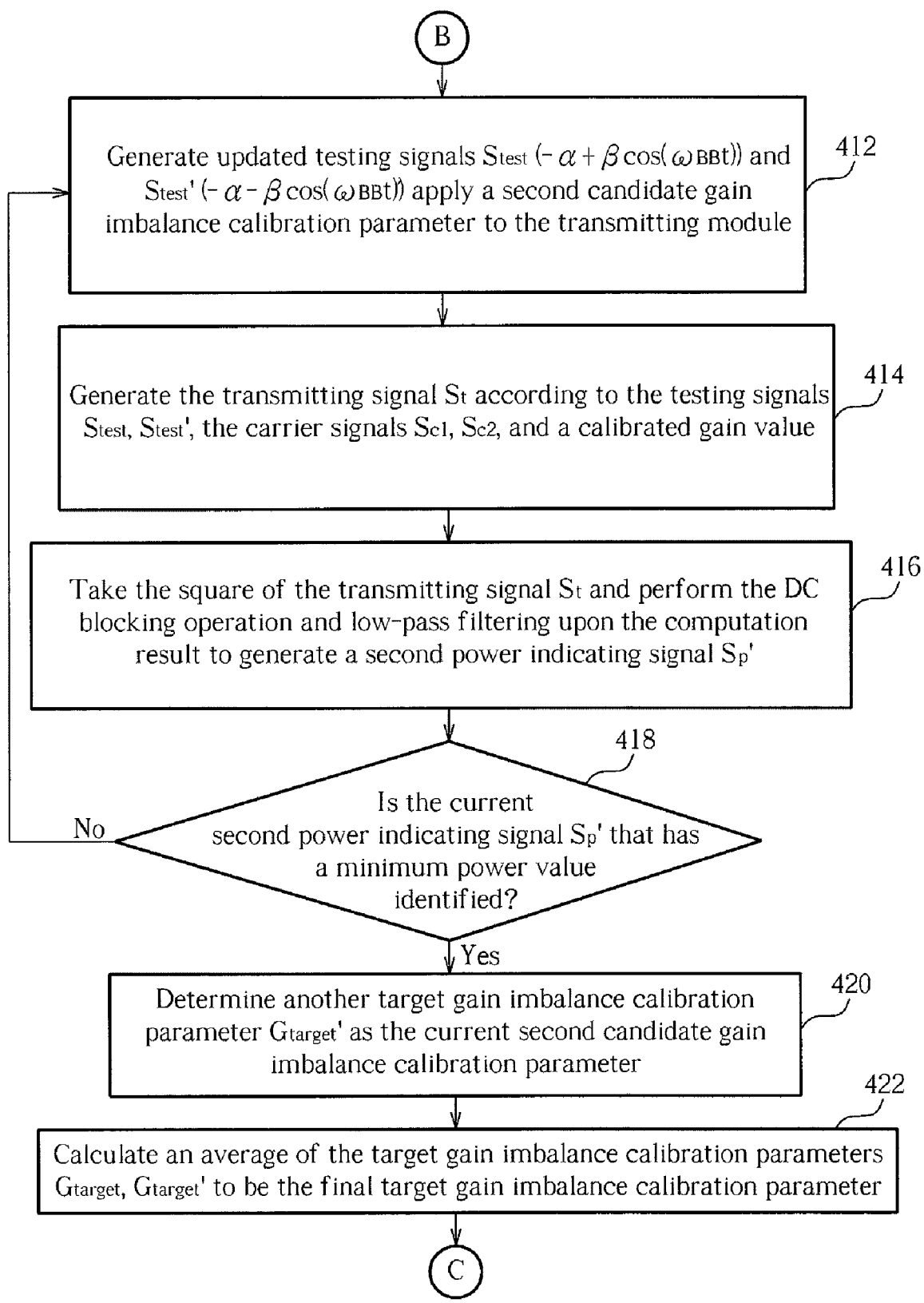
FIG. 5 is a flowchart continuing the above-mentioned procedure of calibrating the IQ imbalance.
Figure 6:
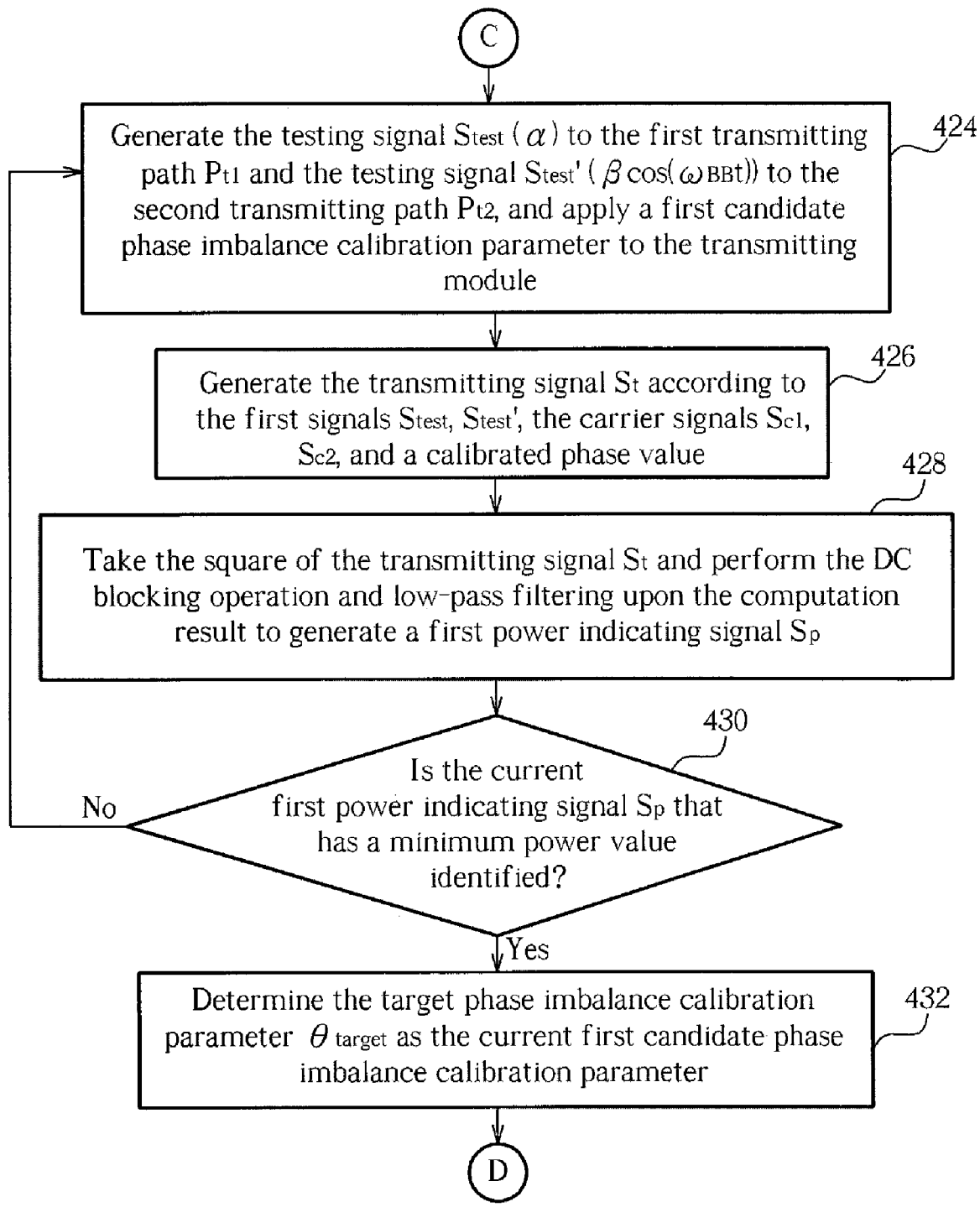
FIG. 6 is a flowchart continuing the above-mentioned procedure of calibrating the IQ imbalance shown in FIG. 5.
Figure 7:
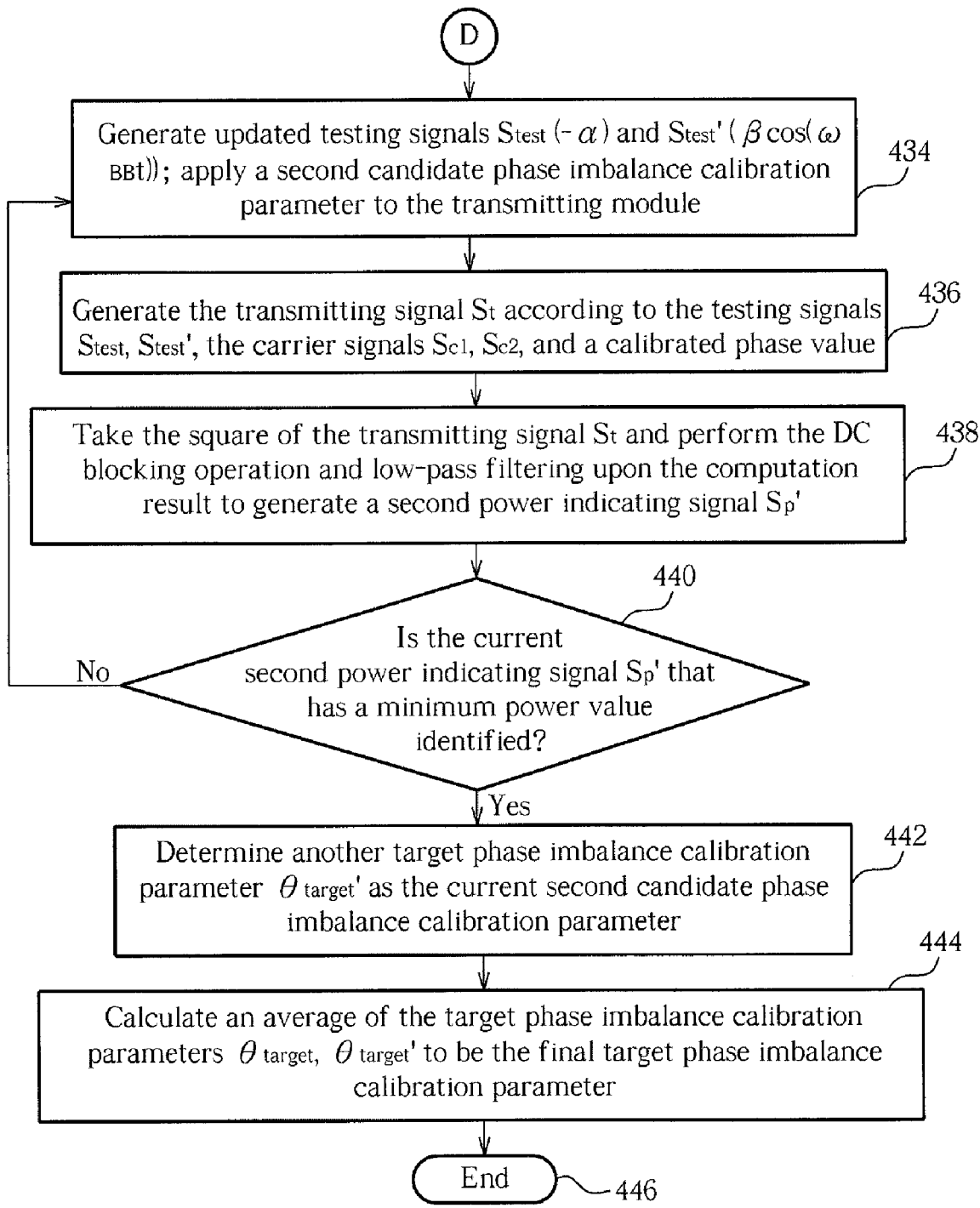
FIG. 7 is a flowchart continuing the above-mentioned procedure of calibrating the IQ imbalance shown in FIG. 6.

Please refer to FIG. 4, FIG. 5, FIG. 6, and FIG. 7. FIG. 4 is a flowchart showing the above-mentioned procedure of calibrating the IQ imbalance (comprising gain imbalance and phase imbalance) in the communication system 100 according to an embodiment of the present invention. FIG. 5 is a flowchart continuing the above-mentioned procedure of calibrating the IQ imbalance. FIG. 6 is a flowchart continuing the above-mentioned procedure of calibrating the IQ imbalance shown in FIG. 5. FIG. 7 is a flowchart continuing the above-mentioned procedure of calibrating the IQ imbalance shown in FIG. 6. The steps for calibrating the IQ imbalance are shown as follows:

Step 400: The communication system 100 is started.

Step 402: The testing signal generator 108 generates the testing signal $S_{test}$ to the first transmitting path $P_{t1}$ and the testing signal $S_{test}'$ to the second transmitting path $P_{t2}$, wherein the testing signal $S_{test}$ equals $\alpha + \beta \cos(\omega_{BB}t)$ and the testing signal $S_{test}'$ equals $\alpha - \beta \cos(\omega_{BB}t)$; the calibration apparatus 112 further applies a first candidate gain imbalance calibration parameter to the transmitting module 104.

Step 404: The transmitting module 104 generates the transmitting signal $S_t$ according to the testing signal $S_{test}$, the testing signal $S_{test}'$, the first carrier signal $S_{c1}$, the second carrier signal $S_{c2}$, and a calibrated gain value due to the first candidate gain imbalance calibration parameter.

Step 406: The power detection unit 110 takes the square of the transmitting signal $S_t$ and performs the DC blocking operation and low-pass filtering upon the square of the transmitting signal $S_t$ to generate a first power indicating signal $S_p$ to the receiving module 106; the calibration apparatus 112 receives the first power indicating signal $S_p$ through the receiving module 106.

Step 408: Does the calibration apparatus 112 identify that the current first power indicating signal $S_p$ has a minimum power value among gathered first power indicating signals? If yes, go to Step 410; otherwise, go to Step 402 for applying another first candidate gain imbalance calibration parameter to the transmitting module 104.

Step 410: The calibration apparatus 112 determines the target gain imbalance calibration parameter $G_{target}$ as the specific first candidate gain imbalance calibration parameter corresponding to the specific first power indicating signal.

Step 412: The testing signal generator 108 updates the testing signal $S_{test}$ inputted to the first transmitting path $P_{t1}$ and the testing signal $S_{test}'$ inputted to the second transmitting path $P_{t2}$, wherein the updated testing signal $S_{test}$ equals $-\alpha+\beta \cos(\omega_{BB}t)$ and the updated testing signal $S_{test}'$ equals $-\alpha-\beta \cos(\omega_{BB}t)$; the calibration apparatus 112 applies a second candidate gain imbalance calibration parameter to the transmitting module 104.

Step 414: The transmitting module 104 generates the transmitting signal $S_t$ according to the testing signal $S_{test}$, the testing signal $S_{test}'$, the first carrier signal $S_{c1}$, the second carrier signal $S_{c2}$, and a calibrated gain value due to the second candidate gain imbalance calibration parameter.

Step 416: The power detection unit 110 takes the square of the transmitting signal $S_t$ and performs the DC blocking operation and low-pass filtering upon the square of the transmitting signal $S_t$ to generate a second power indicating signal $S_p'$ to the receiving module 106; the calibration apparatus 112 receives the second power indicating signal $S_p'$ through the receiving module 106.

Step 418: Does the calibration apparatus 112 identify that the current second power indicating signal $S_p'$ has a minimum power value among gathered second power indicating signals? If yes, go to Step 420; otherwise, go to Step 412 for applying another second candidate gain imbalance calibration parameter to the transmitting module 104.

Step 420: The calibration apparatus 112 determines another target gain imbalance calibration parameter $G_{target}'$ as the specific second candidate gain imbalance calibration parameter corresponding to the specific second power indicating signal.

Step 422: The calibration apparatus 112 calculates an average of the specific first candidate gain imbalance calibration parameter (i.e. the target gain imbalance calibration parameter $G_{target}$) and the specific second candidate gain imbalance calibration parameter (i.e. the target gain imbalance calibration parameter $G_{target}'$) to be the final target imbalance calibration parameter.

Step 424: The testing signal generator 108 generates the testing signal $S_{test}$ to the first transmitting path $P_{t1}$ and the testing signal $S_{test}'$ to the second transmitting path $P_{t2}$, wherein the testing signal $S_{test}$ equals the DC value $\alpha$, and the testing signal $S_{test}'$ equals the single tone testing signal $\beta \cos(\omega_{BB}t)$; the calibration apparatus 112 applies a first candidate phase imbalance calibration parameter to the transmitting module 104.

Step 426: The transmitting module 104 generates the transmitting signal $S_t$ according to the first signal $S_{test}$, the second signal $S_{test}'$, the first carrier signal $S_{c1}$, the second carrier signal $S_{c2}$, and a calibrated phase value due to the first candidate phase imbalance calibration parameter.

Step 428: The power detection unit 110 takes the square of the transmitting signal $S_t$ and performs the DC blocking operation and low-pass filtering upon the square of the transmitting signal $S_t$ to generate a first power indicating signal $S_p$ to the receiving module 106; the calibration apparatus 112 receives the first power indicating signal $S_p$ through the receiving module 106.

Step 430: Does the calibration apparatus 112 identify that the current first power indicating signal $S_p$ has a minimum power value among gathered first power indicating signals? If yes, go to Step 432; otherwise, go to Step 424 for applying another first candidate phase imbalance calibration parameter to the transmitting module 104.

Step 432: The calibration apparatus 112 determines the target phase imbalance calibration parameter $\theta_{target}$ as the specific first candidate phase imbalance calibration parameter corresponding to the specific first power indicating signal.

Step 434: The testing signal generator 108 updates the testing signal $S_{test}$ inputted to the first transmitting path $P_{t1}$ and the testing signal $S_{test}'$ inputted to the second transmitting path $P_{t2}$, wherein the updated testing signal $S_{test}$ equals the DC value $-\alpha$, and the updated testing signal $S_{test}'$ equals the single tone testing signal $\beta \cos(\omega_{BB}t)$; the calibration apparatus 112 applies a second candidate phase imbalance calibration parameter to the transmitting module 104.

Step 436: The transmitting module 104 generates the transmitting signal $S_t$ according to the testing signal $S_{test}$, the testing signal $S_{test}'$, the first carrier signal $S_{c1}$, the second carrier signal $S_{c2}$, and a calibrated phase value due to the second candidate phase imbalance calibration parameter.

Step 438: The power detection unit 110 takes the square of the transmitting signal $S_t$ and performs the DC blocking operation and low-pass filtering upon the square of the transmitting signal $S_t$ to generate a second power indicating signal $S_p'$ to the receiving module 106; the calibration apparatus 112 receives the second power indicating signal $S_p'$ through the receiving module 106.

Step 440: Does the calibration apparatus 112 identify that the current second power indicating signal $S_p'$ has a minimum power value among gathered second power indicating signals? If yes, go to Step 442; otherwise, go to Step 434 for applying another second candidate phase imbalance calibration parameter to the transmitting module 104.

Step 442: The calibration apparatus 112 determines another target phase imbalance calibration parameter $\theta_{target}'$ as the specific second candidate phase imbalance calibration parameter corresponding to the specific second power indicating signal.

Step 444: The calibration apparatus 112 calculates an average of the specific first candidate phase imbalance calibration parameter (i.e. the target phase imbalance calibration parameter $\theta_{target}$) and the specific second candidate phase imbalance calibration parameter (i.e. the target phase imbalance calibration parameter $\theta_{target}'$) to be the final target imbalance calibration parameter.

Step 446: End.

Please note that, in this embodiment, the procedure of calibrating the carrier leakage is performed before that of calibrating the IQ imbalance; however, the procedure of calibrating the IQ imbalance can also be performed before that of calibrating the carrier leakage. Similarly, the procedure of calibrating the gain imbalance is performed before that of calibrating the phase imbalance; however, the procedure of calibrating the phase imbalance can also be performed before that of calibrating the gain imbalance. In another embodiment, it is possible to only apply one of the procedures of calibrating the DC offsets and the IQ imbalance, i.e. the disclosed carrier leakage calibration process and the disclosed IQ imbalance calibration process are not limited to be executed on the communication system after the communication system is powered on. In addition, the single tone testing signal and testing signals defined above are only taken as examples to illustrate the workings of the present invention. These are not meant to be limitations of the present invention, however.

In addition, any extreme value searching scheme can be utilized to locate a specific power indicating signal having a minimum power value. The extreme value searching schemes shown in FIG. 4, FIG. 5, FIG. 6, and FIG. 7 are only for illustrative purposes. For example, the calibration apparatus 112 outputs a plurality of IQ imbalance calibration parameters sequentially, and obtains a plurality of corresponding power indicating signals from the power detection unit 110. Then, the calibration apparatus 112 starts searching the desired target IQ imbalance calibration parameter utilizing information given by these gathered power indicating signals. Additionally, any method for detecting a power level of the first/second power indicating signal $S_p/S_p'$ is also suitable for the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A communication system for calibrating a carrier leakage in a transmission signal, the communication system comprising:
    a carrier signal generator, for generating a first carrier signal to a first transmitting path and a second carrier signal to a second transmitting path;
    a transmitting module, coupled to the carrier signal generator and having the first transmitting path and the second transmitting path, for generating the transmission signal according to a single tone testing signal inputted to the first transmitting path, the first carrier signal and the second carrier signal;
    a testing signal generator, coupled to the transmitting module, for generating the single tone testing signal having a specific frequency;
    a power detection unit, coupled to the transmitting module, for detecting power of components associated with the specific frequency in the transmission signal to generate a power indicating signal; and
    a calibration apparatus, coupled to the transmitting module and the power detection unit, for applying at least a first candidate carrier leakage calibration parameter to the first transmitting path and determining a target carrier leakage calibration parameter of the first transmitting path according to a first power indicating signal corresponding to the first candidate carrier leakage calibration parameter;
    wherein when the calibration apparatus is determining the target carrier leakage calibration parameter of the first transmitting path, the testing signal generator generates the single tone testing signal to the first transmitting path but not to the second transmitting path.

2. The communication system of claim 1, wherein the calibration apparatus applies a plurality of first candidate carrier leakage calibration parameters, the power detection unit generates a plurality of first power indicating signals corresponding to the first candidate carrier leakage calibration parameters respectively, and the calibration apparatus further determines a specific first power indicating signal of the first power indicating signals that has an extreme power value and determines a specific first candidate carrier leakage calibration parameter corresponding to the specific first power indicating signal as the target carrier leakage calibration parameter of the first transmitting path.

3. The communication system of claim 1, wherein after the target carrier leakage calibration parameter of the first transmitting path is determined, the testing signal generator generates the single tone testing signal to the second transmitting path, the transmitting module generates the transmission signal according to the single tone testing signal inputted to the second transmitting path, the first carrier signal and the second carrier signal, and the calibration apparatus applies the target carrier leakage calibration parameter of the first transmitting path, applies at least a second candidate carrier leakage calibration parameter to the second transmitting path and then references a second power indicating signal corresponding to the second candidate carrier leakage calibration parameter to determine a target carrier leakage calibration parameter of the second transmitting path.

4. The communication system of claim 3, wherein after the target carrier leakage calibration parameter of the second transmitting path is determined, the testing signal generator generates the single tone testing signal to the first transmitting path, the transmitting module generates the transmission signal according to the single tone testing signal inputted to the first transmitting path, the first carrier signal and the second carrier signal, and the calibration apparatus applies the target carrier leakage calibration parameter of the second transmitting path instead of applying the target carrier leakage calibration parameter of the first transmitting path, applies at least a third candidate carrier leakage calibration parameter to the first transmitting path and then references a third power indicating signal corresponding to the third candidate carrier leakage calibration parameter to determine a calibrated target carrier leakage calibration parameter of the first transmitting path.

5. A communication system for determining at least a target imbalance calibration parameter for calibrating an IQ imbalance in a transmission signal, the communication system comprising:
    a carrier signal generator, for generating a first carrier signal to a first transmitting path and a second carrier signal to a second transmitting path;
    a transmitting module, coupled to the carrier signal generator and having the first transmitting path and the second transmitting path, the transmitting module for generating the transmission signal according to a first testing signal inputted to the first transmitting path, a second testing signal inputted to the second transmitting path, the first carrier signal, and the second carrier signal;
    a testing signal generator, coupled to the transmitting module, for generating the first testing signal and the second testing signal according to combinations of a DC value and a single tone signal having a specific frequency, wherein the first testing signal is different from the second testing signal;
    a power detection unit, coupled to the transmitting module, for detecting power of components associated with the specific frequency in the transmission signal to generate a power indicating signal; and
    a calibration apparatus, coupled to the transmitting module and the power detection unit, for applying at least a first candidate imbalance calibration parameter to the transmitting module and determining the target imbalance calibration parameter according to a first power indicating signal corresponding to the first candidate imbalance calibration parameter;

wherein when the calibration apparatus is determining the target imbalance calibration parameter, the testing signal generator generates the first testing signal to the first transmitting path but not to the second transmitting path.

6. The communication system of claim 5, wherein the calibration apparatus applies a plurality of first candidate imbalance calibration parameters, the power detection unit generates a plurality of first power indicating signals corresponding to the first candidate imbalance calibration parameters respectively, and the calibration apparatus further determines a specific first power indicating signal of the first power indicating signals that has an extreme power value and determines the target imbalance calibration parameter according to a specific first candidate imbalance calibration parameter corresponding to the specific first power indicating signal.

7. The communication system of claim 6, wherein the testing signal generator further generates a third testing signal and a fourth testing signal according to combinations of the DC value and the single tone signal and outputs the third testing signal and the fourth testing signal to the transmitting module; and after the testing signal generator outputs the third testing signal to the first transmitting path instead of the first testing signal and outputs the fourth testing signal to the second transmitting path instead of the second testing signal, the transmitting module then generates the transmission signal according to the third testing signal, the fourth testing signal, the first carrier signal, and the second carrier signal, and the calibration apparatus applies a plurality of second candidate imbalance calibration parameters, the power detection unit generates a plurality of second power indicating signals corresponding to the second candidate imbalance calibration parameters respectively, and the calibration apparatus further determines a specific second power indicating signal of the second power indicating signals that has an extreme power value and determines the target imbalance calibration parameter according to the specific first candidate imbalance calibration parameter and a specific second candidate imbalance calibration parameter corresponding to the specific second power indicating signal.

8. The communication system of claim 7, wherein the calibration apparatus calculates an average of the specific first candidate imbalance calibration parameter and the specific second candidate imbalance calibration parameter to be the target imbalance calibration parameter.

9. The communication system of claim 5, wherein the testing signal generator further generates a third testing signal and a fourth testing signal according to combinations of the DC value and the single tone signal and outputs the third testing signal and the fourth testing signal to the transmitting module; and after the testing signal generator outputs the third testing signal to the first transmitting path instead of the first testing signal and outputs the fourth testing signal to the second transmitting path instead of the second testing signal, the transmitting module then generates the transmission signal according to the third testing signal, the fourth testing signal, the first carrier signal, and the second carrier signal; the calibration apparatus applies at least a second candidate imbalance calibration parameter to the transmitting module and then references the first power indicating signal and a second power indicating signal corresponding to the second candidate imbalance calibration parameter to determine the target imbalance calibration parameter.

10. The communication system of claim 9, wherein the calibration apparatus calculates an average of the first candidate imbalance calibration parameter and the second candidate imbalance calibration parameter to be the target imbalance calibration parameter.

11. A communication method for calibrating a carrier leakage in a transmission signal, the communication method comprising:
generating a first carrier signal to a first transmitting path and a second carrier signal to a second transmitting path;
providing a transmitting module having the first transmitting path and the second transmitting path, and utilizing the transmitting module to generate the transmission signal according to a single tone testing signal inputted to the first transmitting path, the first carrier signal, and the second carrier signal;
generating the single tone testing signal having a specific frequency;
detecting power of components associated with the specific frequency in the transmission signal to generate a power indicating signal; and
applying at least a first candidate carrier leakage calibration parameter to the first transmitting path and determining a target carrier leakage calibration parameter of the first transmitting path according to a first power indicating signal corresponding to the first candidate carrier leakage calibration parameter;
wherein during the step of determining the target carrier leakage calibration parameter of the first transmitting path, the single tone testing signal is generated to the first transmitting path but not to the second transmitting path.

12. The communication method of claim 11, further comprising:
applying a plurality of first candidate carrier leakage calibration parameters; generating a plurality of first power indicating signals corresponding to the first candidate carrier leakage calibration parameters respectively;
determining a specific first power indicating signal of the first power indicating signals that has an extreme power value; and
determining a specific first candidate carrier leakage calibration parameter corresponding to the specific first power indicating signal as the target carrier leakage calibration parameter of the first transmitting path.

13. The communication method of claim 11, further comprising:
generating the single tone testing signal to the second transmitting path instead after the target carrier leakage calibration parameter of the first transmitting path is determined;
utilizing the transmitting module to generate the transmission signal according to the single tone testing signal inputted to the second transmitting path, the first carrier signal, and the second carrier signal; and
applying the target carrier leakage calibration parameter of the first transmitting path and at least a second candidate carrier leakage calibration parameter to the second transmitting path, and determining a target carrier leakage calibration parameter of the second transmitting path according to a second power indicating signal corresponding to the second candidate carrier leakage calibration parameter.

14. The communication method of claim 13, further comprising:
generating the single tone testing signal to the first transmitting path after the target carrier leakage calibration parameter of the second transmitting path is determined;
utilizing the transmitting module to generate the transmission signal according to the single tone testing signal inputted to the first transmitting path, the first carrier signal, and the second carrier signal;

applying the target carrier leakage calibration parameter of the second transmitting path instead of applying the target carrier leakage calibration parameter of the first transmitting path; and applying at least a third candidate carrier leakage calibration parameter to the first transmitting path and then determining a calibrated target carrier leakage calibration parameter of the first transmitting path according to a third power indicating signal corresponding to the third candidate carrier leakage calibration parameter.

15. A communication method for determining at least a target imbalance calibration parameter for calibrating an IQ imbalance in a transmission signal, the communication method comprising:

generating a first carrier signal to a first transmitting path and a second carrier signal to a second transmitting path;

providing a transmitting module having the first transmitting path and the second transmitting path to generate the transmission signal according to a first testing signal inputted to the first transmitting path, a second testing signal inputted to the second transmitting path, the first carrier signal, and the second carrier signal;

generating the first testing signal and the second testing signal according to combinations of a DC value and a single tone signal having a specific frequency, wherein the first testing signal is different from the second testing signal;

detecting power of components associated with the specific frequency in the transmission signal to generate a power indicating signal; and applying at least a first candidate imbalance calibration parameter to the transmitting module and then determining the target imbalance calibration parameter according to a first power indicating signal corresponding to the first candidate imbalance calibration parameter;

wherein during the step of determining the target imbalance calibration parameter, the first testing signal is generated to the first transmitting path but not to the second transmitting path.

16. The communication method of claim 15, further comprising:

applying a plurality of first candidate imbalance calibration parameters;

generating a plurality of first power indicating signals corresponding to the first candidate imbalance calibration parameters respectively;

determining a specific first power indicating signal of the first power indicating signals that has an extreme power value; and determining the target imbalance calibration parameter according to a specific first candidate imbalance calibration parameter corresponding to the specific first power indicating signal.

17. The communication method of claim 16, further comprising:

generating a third testing signal and a fourth testing signal according to combinations of the DC value and the single tone signal, and outputting the third testing signal and the fourth testing signal to the transmitting module;

utilizing the transmitting module to generate the transmission signal according to the third testing signal, the fourth testing signal, the first carrier signal, and the second carrier signal after outputting the third testing signal to the first transmitting path instead of the first testing signal and outputting the fourth testing signal to the second transmitting path instead of the second testing signal;

applying a plurality of second candidate imbalance calibration parameters and generating a plurality of second power indicating signals corresponding to the second candidate imbalance calibration parameters respectively;

determining a specific second power indicating signal of the second power indicating signals that has an extreme power value; and determining the target imbalance calibration parameter according to the specific first candidate imbalance calibration parameter and a specific second candidate imbalance calibration parameter corresponding to the specific second power indicating signal.

18. The communication method of claim 17, wherein the step of determining the target imbalance calibration parameter comprises:

calculating an average of the specific first candidate imbalance calibration parameter and the specific second candidate imbalance calibration parameter to be the target imbalance calibration parameter.

19. The communication method of claim 15, further comprising:

generating a third testing signal and a fourth testing signal according to combinations of the DC value and the single tone signal, and outputting the third testing signal and the fourth testing signal to the transmitting module;

utilizing the transmitting module to generate the transmission signal according to the third testing signal, the fourth testing signal, the first carrier signal, and the second carrier signal after outputting the third testing signal to the first transmitting path instead of the first testing signal, and outputting the fourth testing signal to the second transmitting path instead of the second testing signal; and applying at least a second candidate imbalance calibration parameter to the transmitting module and determining the target imbalance calibration parameter according to the first power indicating signal and a second power indicating signal corresponding to the second candidate imbalance calibration parameter.

20. The communication method of claim 19, wherein the step of determining the target imbalance calibration parameter according to the first power indicating signal and the second power indicating signal comprises:

calculating an average of the first candidate imbalance calibration parameter and the second candidate imbalance calibration parameter to be the target imbalance calibration parameter.

* * * * *